(12) United States Patent
Hudson et al.

(10) Patent No.: US 9,669,985 B1
(45) Date of Patent: Jun. 6, 2017

(54) PHOTOVOLTAIC MODULE STACKABLE CORNER PROTECTOR

(71) Applicant: SolarCity Corporation, San Mateo, CA (US)

(72) Inventors: Tyrus Hudson, San Rafael, CA (US); Kyle Tripp, San Rafael, CA (US); William Buchanan, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 48 days.

(21) Appl. No.: 14/941,438

(22) Filed: Nov. 13, 2015

(51) Int. Cl.
  *B65D 81/02* (2006.01)
  *B65D 85/48* (2006.01)
  *B65D 81/05* (2006.01)
  *H02S 40/00* (2014.01)
  *F24J 2/52* (2006.01)

(52) U.S. Cl.
  CPC ............ *B65D 81/054* (2013.01); *H02S 40/00* (2013.01); *B65D 81/053* (2013.01); *B65D 81/056* (2013.01); *F24J 2002/5279* (2013.01)

(58) Field of Classification Search
  CPC .... B65D 57/00; B65D 81/053; B65D 81/056; B65D 81/057; B65D 81/58; B65D 81/055; B65D 81/054; B65D 85/48; H01L 31/0422; H01L 31/048; H01L 21/6734; H05K 7/1435; H05K 5/0021; F24J 2/46; F24J 2/526; F24J 2/464; Y02E 10/40; Y02E 10/50; F16M 13/00
  USPC .............. 206/453, 454, 586, 509, 449, 511; 211/41.1, 41.14, 49.1; 361/790, 732, 361/733; 248/682; 136/244, 252, 251, 136/291; D13/101, 102, 10
  See application file for complete search history.

(56) References Cited

U.S. PATENT DOCUMENTS

| 2,019,778 | A | * | 11/1935 | Enholm | ............... | B65D 81/057 |
| | | | | | | 206/584 |
| 2,738,564 | A | * | 3/1956 | Guinane | ................. | F26B 25/18 |
| | | | | | | 206/322 |
| 2,826,906 | A | * | 3/1958 | Rice | ..................... | A63H 33/088 |
| | | | | | | 160/229.1 |
| 3,446,345 | A | * | 5/1969 | Ottar | ..................... | B65D 59/00 |
| | | | | | | 206/453 |
| 3,836,043 | A | * | 9/1974 | Levin | ................... | B65D 81/056 |
| | | | | | | 206/504 |

(Continued)

*Primary Examiner* — J. Gregory Pickett
*Assistant Examiner* — Gideon Weinerth
(74) *Attorney, Agent, or Firm* — Kilpatrick Townsend & Stockton LLP (57) ABSTRACT

The disclosure describes various stackable corner protector configurations. The corner protectors can have curved lateral surfaces that allow the corner protectors to be decoupled from a photovoltaic module to which they are coupled to by rotating one end of the corner protectors away from the object. This removal process works even more efficiently with multiple stacked corner protectors as the stacked corner protectors can be concurrently removed from the object by rotating the stacked corner protectors away from the object together. The corner protector can also include one or more attachment features for securing the corner protector to the object. For example, when the corner protector is installed on a photovoltaic module, the attachment feature can engage a lip defined by a recess or channel of the photovoltaic module.

20 Claims, 11 Drawing Sheets

(56) References Cited

U.S. PATENT DOCUMENTS

| | | | |
|---|---|---|---|
| 4,951,821 A * | 8/1990 | Kempkes | B65D 85/54 206/453 |
| D354,319 S * | 1/1995 | Wilson | D21/503 |
| 5,421,135 A * | 6/1995 | Stevens | E04B 2/16 405/284 |
| 5,677,830 A * | 10/1997 | Nogas | H05K 7/1435 361/732 |
| 6,881,469 B2 * | 4/2005 | Hightower | B65D 81/055 206/453 |
| D557,795 S * | 12/2007 | Esjunin | D23/422 |
| D598,756 S * | 8/2009 | Robichaud | D8/403 |
| 8,109,393 B2 * | 2/2012 | Haeberlein | F24J 2/5205 211/41.14 |
| 8,328,020 B2 * | 12/2012 | Flossmann | F24J 2/00 206/586 |
| D710,792 S * | 8/2014 | Cai | D13/102 |
| 8,991,602 B2 * | 3/2015 | Kashima | B65D 57/00 206/453 |
| D733,645 S * | 7/2015 | Cai | D13/102 |
| 2002/0144923 A1 * | 10/2002 | Baechle | B65D 81/053 206/453 |
| 2006/0005875 A1 * | 1/2006 | Haberlein | B65D 57/00 136/251 |
| 2007/0039848 A1 * | 2/2007 | Burchell | B65D 81/057 206/453 |
| 2011/0259404 A1 * | 10/2011 | Jang | H02S 30/10 136/251 |
| 2012/0048350 A1 * | 3/2012 | Gonzalez | B65D 81/057 136/251 |
| 2012/0082537 A1 * | 4/2012 | Yoshida | B65D 57/00 414/802 |
| 2012/0163954 A1 * | 6/2012 | Yoshida | B65D 57/00 414/802 |
| 2012/0305444 A1 * | 12/2012 | Fujita | B65D 81/056 206/701 |
| 2013/0327669 A1 * | 12/2013 | Sueoka | B65D 19/0036 206/453 |
| 2014/0237943 A1 * | 8/2014 | Flam | B65D 81/057 53/397 |
| 2014/0238489 A1 * | 8/2014 | Buettner | F24J 2/5243 136/259 |
| 2014/0367305 A1 * | 12/2014 | Mizuo | B65D 85/48 206/585 |

* cited by examiner

PHOTOVOLTAIC MODULE STACKABLE CORNER PROTECTOR

FIELD OF THE INVENTION

This disclosure is generally related to devices used in the shipment and/or transportation of photovoltaic modules. More specifically, this disclosure is related to a stackable corner protector that can be quickly installed and removed.

BACKGROUND

The shipment and transportation of photovoltaic modules can be costly and time intensive. Because photovoltaic modules can be susceptible to damage when dropped or jostled, shipment of the photovoltaic modules often involves the use of packing materials. Depending on its wattage, a single module can cost over $200. Therefore it's critical that modules are transported in a way that protects them from breaking. Unfortunately, the manual removal of the packing materials by installation workers can be time intensive. In particular, corner protectors generally have to be removed one at a time, greatly increasing an amount of time needed to unpack a number of the photovoltaic modules. For these reasons, packing materials that can be quickly removed are desired.

SUMMARY

This disclosure describes various embodiments that relate to stackable corner protectors for photovoltaic modules.

A modular corner protector suitable for protecting a module is disclosed. The corner protector includes the following: a first cylindrical support structure; a second cylindrical support structure; a first support member coupled with both a first end of the first cylindrical support structure and a first end of the second cylindrical support structure, an interior-facing portion of the first support member disposed between the first and second cylindrical support structures and including walls that define a recessed region having a size and shape in accordance with a portion of a corner of the module; and a second support member coupled with both a second end of the first cylindrical support structure and a second end of the second cylindrical support structure. The support members and the cylindrical support structures cooperate to define an opening configured to receive a corner of the module.

In many embodiments, the modular corner protector also includes a first protrusion and a second protrusion extending from the first support member.

In many embodiments, a longitudinal axis of the first and second protrusions are substantially parallel to a longitudinal axis of the first and second cylindrical support structures.

In many embodiments, the second support member defines first and second opening having a size and shape in accordance with the first and second protrusions.

In many embodiments, the corner protector also includes a first attachment feature extending laterally from a central portion of the first cylindrical support structure; and a second attachment feature extending laterally from a central portion of the second cylindrical support structure in a direction substantially orthogonal to a direction in which the first attachment feature extends.

In many embodiments, a distance between the first and second support members is about the same size as a thickness of the module.

In many embodiments, the first support member is substantially parallel to the second support member.

A corner protector suitable for protecting a corner of a photovoltaic module is disclosed. The corner protector includes the following: a first protrusion and a second protrusion extending from a first end of the corner protector; a second end of the corner protector opposite the first end of the corner protector, the second end defining a first cavity and a second cavity, the first and second cavities spaced apart by the same distance as the first and second protrusions; curved lateral surfaces configured to facilitate rotation of the corner protector off of the corner of the photovoltaic module; and an arm protruding laterally from the corner protector, the arm comprising an engagement feature configured to secure the corner protector to the photovoltaic module by engaging a lip of the photovoltaic module when the corner protector is installed on the photovoltaic module.

In many embodiments, the curved lateral surfaces of the corner protector have a semi-circular geometry.

In many embodiments, the corner protector includes two cylindrical support structures that include the curved lateral surfaces; and two support members coupled to opposing ends of the cylindrical support structures.

In many embodiments, the arm is a first arm and the corner protector also includes a second arm, the first and second arms extending from a first one of the cylindrical support structures and a second one of the cylindrical support structures respectively.

In many embodiments, a longitudinal axis of the first and second protrusions is substantially parallel to a longitudinal axis of the first and second cylindrical support structures.

In many embodiments, the first and second protrusions have different shapes.

In many embodiments, the engagement feature includes a forward portion having a first slope and a rear portion having a second slope substantially greater than the first slope.

A packaging device suitable for protecting a photovoltaic module is disclosed. The packaging device includes the following: a first support structure and a second support structure, each of the support structures having an exterior-facing surface with a semi-circular geometry; a first support member coupled with both a first end of the first support structure and a first end of the second support structure, an interior-facing portion of the first support member disposed between the first and second support structures and including walls that define a recessed region having a size and shape in accordance with a portion of a corner of the photovoltaic module; and a second support member coupled with both a second end of the first support structure and a second end of the second support structure; multiple protrusions extending from an exterior facing surface of the first support member; and multiple recesses defined by an exterior facing surface of the second support member.

In many embodiments, the first support member is substantially parallel to the second support member.

In many embodiments, the first support structure is substantially parallel to the second support structure.

In many embodiments, the packaging device includes an attachment feature extending laterally from the first support structure and at least partially towards the second support structure.

In many embodiments, a central portion of both the first and second support structures defines recesses configured to align a packing strap with the packaging device.

In many embodiments, a longitudinal axis of each of the protrusions is aligned with a longitudinal axis of each of the recesses.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

This description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Shipping materials come in many shapes, sizes and configurations. Shipping materials for low-profile, rectangular objects often take the form of corner protectors. Corner protectors come in many shapes and sizes and are generally arranged at each corner of an article prior to transportation. Corner protectors generally shield the corners of the object from damage but also create a buffer between the object and adjacent surfaces, such as an interior surface of a box or shipping create. When a corner protector is arranged on each corner of the object the buffer is generally created along all surfaces of the object. This buffer helps to prevent rubbing and or scratching of the article against the interior surface. It also creates an area in which an exterior shipping container can deform inward without impacting the object.

Unfortunately, corner protectors are generally setup in a way that requires each to be removed from an item one at a time. While this type of configuration is acceptable when shipping low volumes of material, having to manually remove multiple corner protectors for a large number of devices can be time-consuming, reducing productivity. Furthermore, conventional corner protectors supporting the object above the ground often require the object to be lifted off the ground to accomplish removal of the corner protector thereby even further reducing an efficiency. Furthermore, since the corner protectors are removed one at a time, corners of the object generally rest on the ground while waiting for the other corner protectors to be removed, which increases the likelihood of damage being sustained by the object during removal of the corner protectors.

One solution to this problem is a stackable corner protector with a protector body having rounded outer surfaces that allow the corner protector to be rotated away from or onto the object while the object remains supported by the stackable corner protector. In some embodiments, the body of the stackable corner protector can take the form of two cylindrical support structures arranged in a substantially parallel orientation and separated by a gap sized to accommodate a corner portion of an object between the cylindrical support structures. The cylindrical support structures can be joined together by a first support structure at a first end of the cylindrical support structures and a second support structure at a second end of the cylindrical support structures. Interior facing surfaces of each of the support members can cooperate to define a channel that is complementary to the geometry of the object to which the stackable corner protector is configured to protect. In some embodiments, the channel can take the form of a triangular recess. The channels help to align the stackable corner protector with the object. Each of the cylindrical support structures includes a protrusion at a first end and an opening at a second end, the opening at the second end being configured to accommodate a size and shape of the protrusion. In this way, the protrusions can be used to join the corner protector to another corner protector by inserting the protrusions into the openings of the other corner protector. In some embodiments, the protrusions for a corner protector can have different geometries, thereby preventing the clip protector from being installed backwards.

In some embodiments, the stackable corner protector can also include one or more attachment features that protrude from the stackable corner protector to engage a lip defined by the object. The attachment feature can take the form of a protrusion with an engagement feature positioned at a distal end of the attachment feature. The engagement feature can take the form of a clip having a ramp that allows engagement of the clip to be substantially easier than removal of the clip. In some embodiments, the stackable corner protector can include two attachment features that protrude from a central portion of each cylindrical support structure. The attachment features can be configured to engage a lip of a channel defined by a peripheral portion of the object.

While the described stackable corner protectors could be used to protect any number of types of objects having substantially planar geometries, from this point on the detailed description will describe how the stackable corner protectors can be used to protect one or more photovoltaic modules. The use of photovoltaic modules as exemplary objects should not be construed as limiting and is only done for ease of description.

These and other embodiments are discussed below with reference to FIGS. 1A-9; however, those skilled in the art will readily appreciate that the detailed description given herein with respect to these figures is for explanatory purposes only and should not be construed as limiting.

Figure 1A:
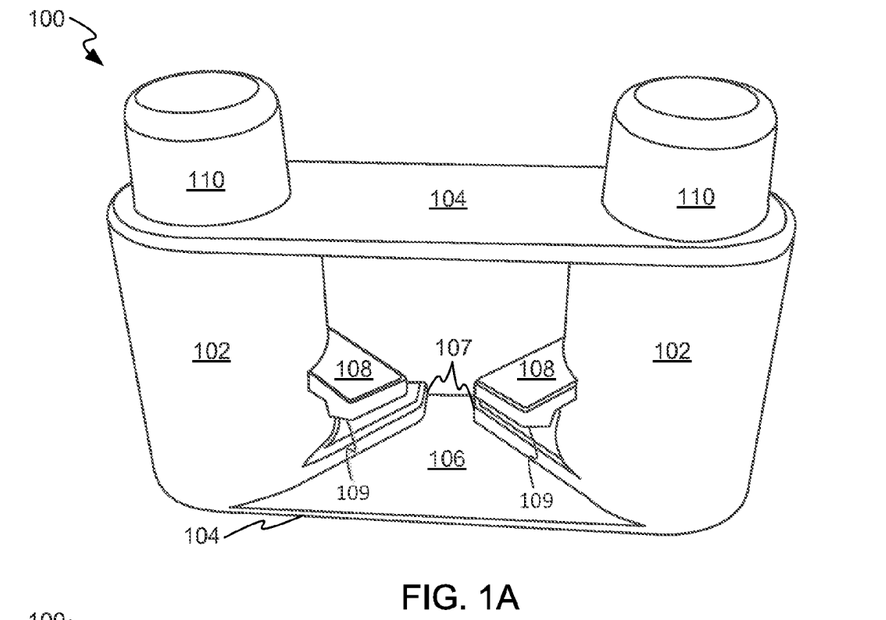
FIG. 1A show a perspective view of an upper portion of an exemplary stackable corner protector according to various embodiments of the invention.

FIG. 1A shows a perspective view of an upper portion of an exemplary stackable corner protector 100. Stackable corner protector 100 can be formed of many different materials including for example, plastic, aluminum, steel and rubber. Stackable corner protector 100 includes two cylindrical support structures 102 arranged in a substantially parallel configuration. Cylindrical support structures 102 can be joined together by two support members 104, which extend between opposing ends of cylindrical support structures 102. Each of support members 104 defines a recessed channel 106 having a substantially triangular shape that conforms to a corner of a photovoltaic module with which the corner protector is designed to reinforce. It should be noted that support members 104 are spaced apart from one another by a distance slightly greater than a thickness of the corner that corner protector 100 is designed to protect. This allows alignment walls 107 defining recessed channels 106 to provide surfaces that support the corners positioned within corner protector 100. While recessed channels 106 of corner protector 100 have about a 90-degree angle to accommodate an object having four 90-degree corners it should be appreciated that a similar corner protector could also be designed to accommodate corners of different angles. For example, a corner protector designed to accommodate an equilateral triangle shaped photovoltaic module could define a 60-degree angles and likewise a corner protector for a pentagonal or hexagonal shape could define wider angles. In this way, it should be appreciated how this corner protector could be adjusted to accommodate corners having any number of angles. Alignment walls 107 can also have different heights. For example, in some embodiments, alignment walls 107 can extend all the way between support members 104, thereby providing a solid wall defining the limits of the insertion of a corner of a photovoltaic module within corner protector 100. Such a configuration would give cylindrical support structures 102 more of a semi-circular geometry, while an interior facing portion of cylindrical support structures 102 would have a more triangular geometry.

Corner protector 100 also includes attachment features 108. Attachment features 108 extend symmetrically with respect to one another from cylindrical support structures 102. In this way, attachment features 108 are able to protrude into a lip associated with a channel defined by the photovoltaic module when the corner of the photovoltaic module is positioned within recessed channels 106. Attachment features 108 include engagement features 109. Engagement features 109 are the portions of attachment features 108 that extend over the lip defined by the photovoltaic module. A front portion of engagement feature 109 includes a gradual slope that deflects attachment feature 108 away from the photovoltaic module until the engagement feature engages the lip of the photovoltaic module. Engagement feature 109 includes a rear portion with a substantially greater slope that makes disengagement of engagement feature 109 from the lip more difficult than the engagement. In this way, attachment feature 108 can be securely engaged with the lip of the photovoltaic module by way of engagement feature 109. It should be noted that the substantially greater slope of the rear portion of engagement feature 109 is still sloped sufficiently to allow disengagement of engagement feature 109 without having to manually lift the end of attachment feature 108 that includes engagement feature 109 away from the lip. Corner protector 100 also includes protrusions 110, which are used to engage and be removably coupled with another corner protector 100. While corner protector 100 is depicted as having a cylindrical shape it should be noted that a different protruding shape could be used instead.

Figure 1B:
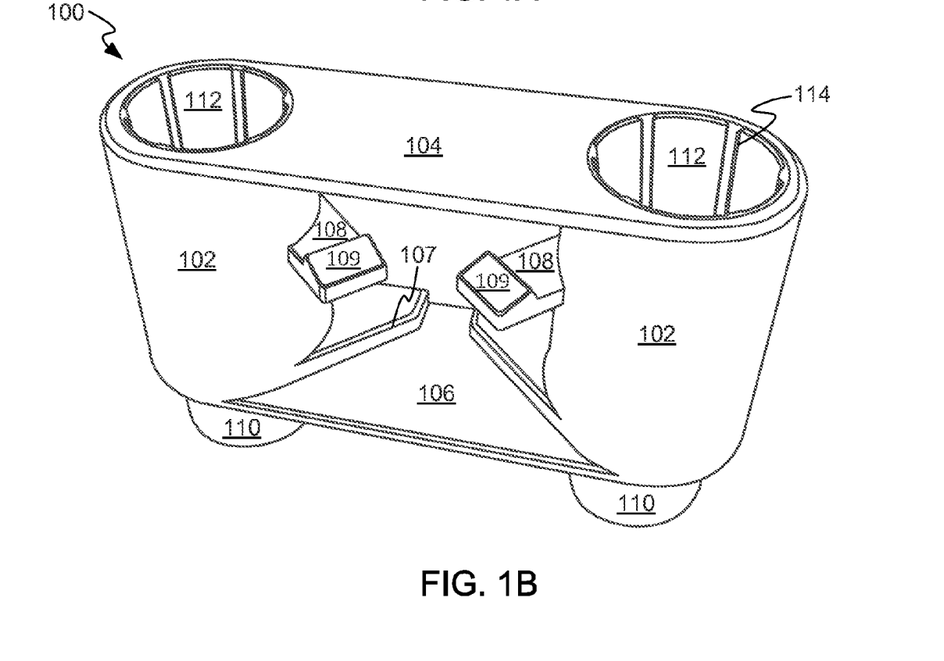
FIG. 1B shows a perspective view of a lower portion of the stackable corner protector depicted in FIG. 1A.

FIG. 1B shows a perspective view of a lower portion of the exemplary stackable corner protector 100. In particular, FIG. 1B shows openings 112 defined by corner protector 100 that have a shape and size substantially complementary to protrusions 110. Sidewalls defining openings 112 can include a series of ridges that protrude into openings 112. Ridges 114 can reduce an amount of friction encountered by protrusions 110 when protrusions 110 are inserted into openings 112 by creating a smaller area of interference between protrusions 110 and interior surfaces defining openings 112. It should be noted that while openings 112 are described as being complementary to protrusions 110, in various embodiments, only the lateral interior surfaces defining openings 112 need to be complementary with protrusions 110. For example, in some embodiments, openings can extend into cylindrical support structures substantially farther than a height of protrusions 110. Such a configuration can reduce an amount of material used to construct corner protector 100.

Figure 2:
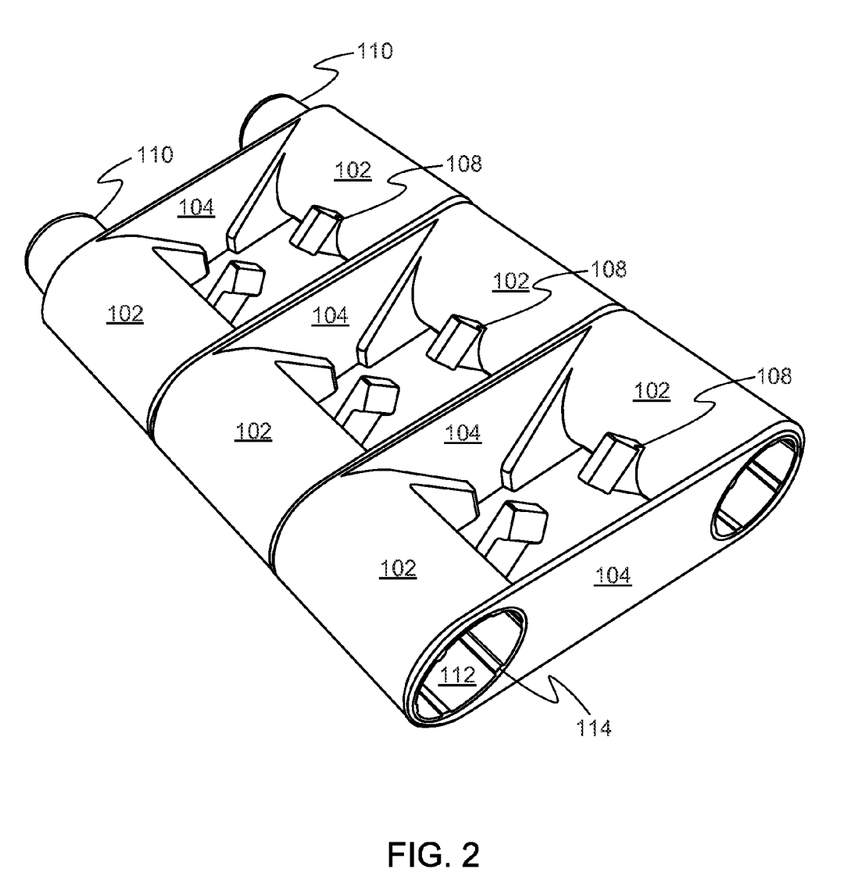
FIG. 2 shows a perspective view of multiple stackable corner protectors arranged in a stacked up configuration.

FIG. 2 shows a perspective view of multiple stackable corner protectors 100. Corner protectors 100 can be stacked together by inserting protrusions 110 into corresponding openings 112. In some embodiments, it can be beneficial to assemble corner protectors 100 in the depicted manner prior to assembly with articles to be packaged, while in other embodiments, corner protectors 100 can be installed on the photovoltaic module one at a time and then engaged with corner protectors installed on another photovoltaic module. For example, large batches of corner protectors 100 could be assembled and placed in specific positions along a surface prior to setting a corresponding number of photovoltaic modules atop the assembled corner protectors. After placing the photovoltaic modules atop the assembled corner protectors the corner protectors could be rotated and locked into position around respective corners of the corresponding photovoltaic modules. In some embodiments, a concurrent reattachment could be desirable when only a small subset of the photovoltaic modules within a stackup are needed. Alternatively, automated machinery can be configured to assemble corner protectors 100 individually on each photovoltaic module. After each photovoltaic module has received its corner protectors 100 it can be assembled into a vertical stackup of other photovoltaic modules. Subsequently, the stack can be picked up and placed in a lateral orientation on a pallet for delivery and installation. Efficiency in the removal of corner protectors 100 can be substantially more useful than assembly on account of removal being typically performed manually by installers as opposed to automated machinery.

Figure 3A:
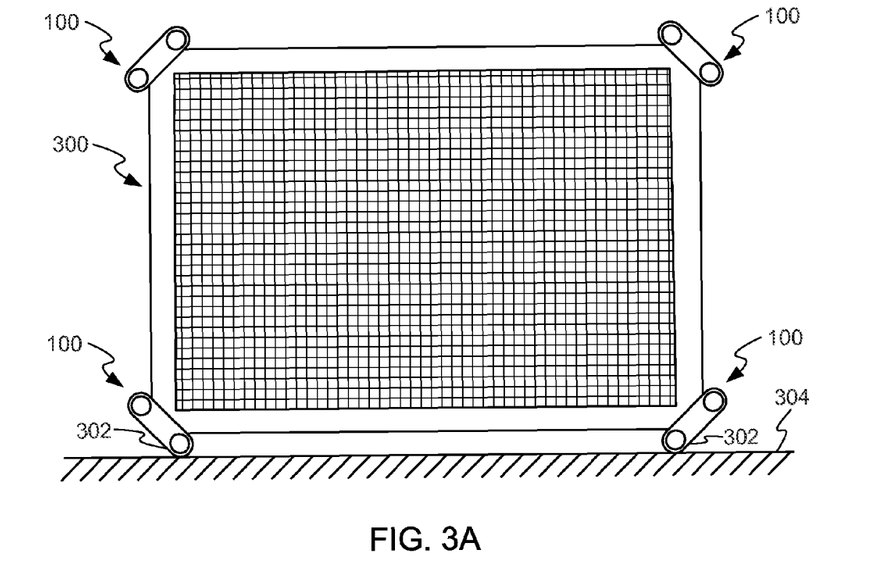
FIG. 3A shows a front view of a photovoltaic module with stackable corner protectors installed on each corner.

FIG. 3A shows a front view of photovoltaic module 300 with stackable corner protectors 100 installed on each corner. As depicted, a load-bearing portion 302 of each of the lower corner protectors 100 supports photovoltaic module 300 above support surface 304. Load-bearing portion 302 generally corresponds to one of cylindrical support structures 102, but can also include at least a portion of alignment wall 107 that contacts a bottom-facing surface of photovoltaic module 300.

Figure 3B:
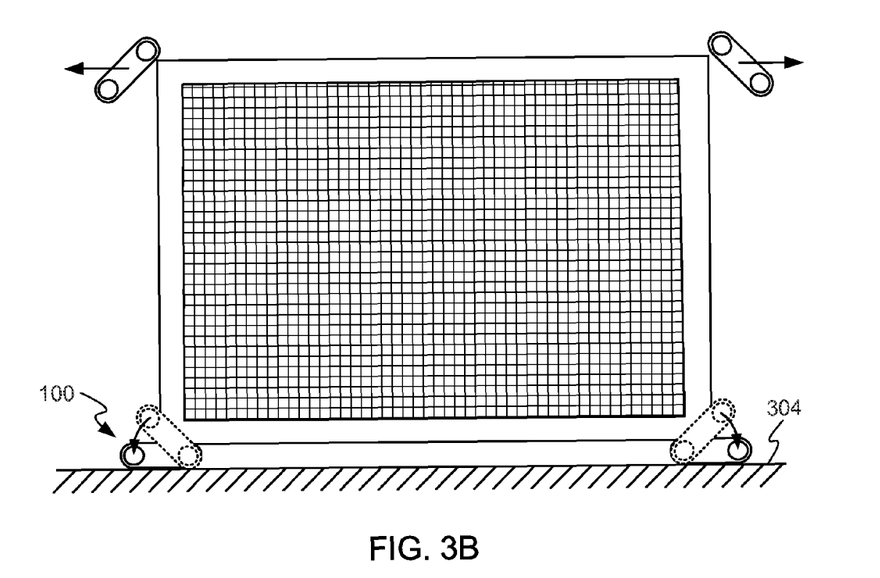
FIG. 3B shows how corner protectors can be removed from the photovoltaic module depicted in FIG. 3A.

FIG. 3B shows how corner protector 100 can be removed from photovoltaic module 300. By rotating the portion of lower corner protector 100 in contact with the sides of photovoltaic module 300 down towards support surface 304, corner protector 100 can be disengaged from photovoltaic module 300 while still supporting photovoltaic module 300 above the surface. Additionally, rotation of one end of corner protector 100 allows only one attachment feature 108 to directly oppose removal of corner protector 100. The direction of removal also allows the removal force exerted to be directed orthogonally with respect to the lip within which attachment features 108 are engaged (see FIG. 4 below). By directing the removal force in this manner the sloped surface of the engagement feature can evenly interact with the lip of photovoltaic module 300, resulting in a consistent amount of resistance to removal. This method of removal can reduce an amount of force needed to remove corner protectors 100 when compared with removing corner protectors 100 directly away from photovoltaic modules 300.

Removal of corner protector 100 in this way can prevent any damage or scuffing that might be caused by photovoltaic module 300 striking the ground during the removal of corner protectors 100, since corner protectors 100 can keep photovoltaic module 300 completely out of contact with support surface 304. Similarly, this method of removal allows large numbers of stacked corner protectors 100 to be removed simultaneously from multiple photovoltaic modules 300. For example, while only a single photovoltaic module 300 is depicted, numerous other photovoltaic modules 300 could be positioned behind the depicted photovoltaic module 300. When the other photovoltaic modules are joined together by corner protectors 100 being engaged with one another the depicted removal motions shown in FIG. 3B would result in rapid removal of corner protectors 100. This type of removal method also does not require reaching between the photovoltaic modules to grab the sides of corner protectors 100, which would be challenging if the corner protectors were stacked together. Instead fingers can reach under the curved lateral surfaces of corner protectors 100 to rotate corner protectors 100 away from photovoltaic modules 300.

Figure 3C:
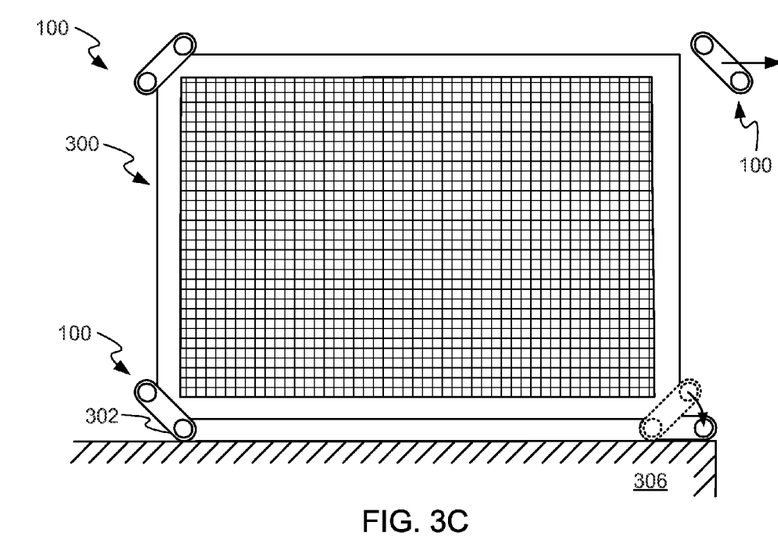
FIGS. 3C-3D show another way in which the corner protectors can be removed from the stack of photovoltaic modules depicted in FIG. 3A.
Figure 3D:
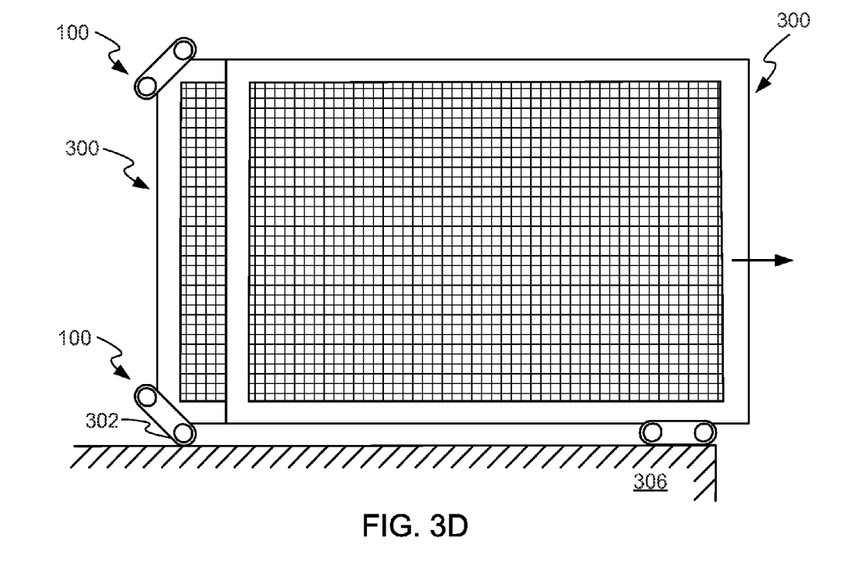

FIG. 3C shows a front view of a stack of photovoltaic modules 300 positioned upon a support surface 306. Support surface 306 can take the form of a truck bed upon which photovoltaic modules 300 are transported. FIG. 3C shows how a first stack of corner protectors can be removed from the stack of photovoltaic modules 300 and a second stack of corner protectors 100 can be rotated down and disengaged from photovoltaic modules 300. FIG. 3D shows how individual photovoltaic modules 300 can be removed from the stack of photovoltaic modules 300 by pulling directly away from the remaining engaged stacks of corner protectors 100. In this way, the remaining portion of the stack can be kept together by the stacks of corner protectors 100 still engaged. This type of removal configuration can make removal of photovoltaic modules 300 from the stack of photovoltaic modules a one person operation because an additional person need not be positioned behind the stack of photovoltaic modules to assist in removing each photovoltaic module 300 from the truck bed.

Figure 4:
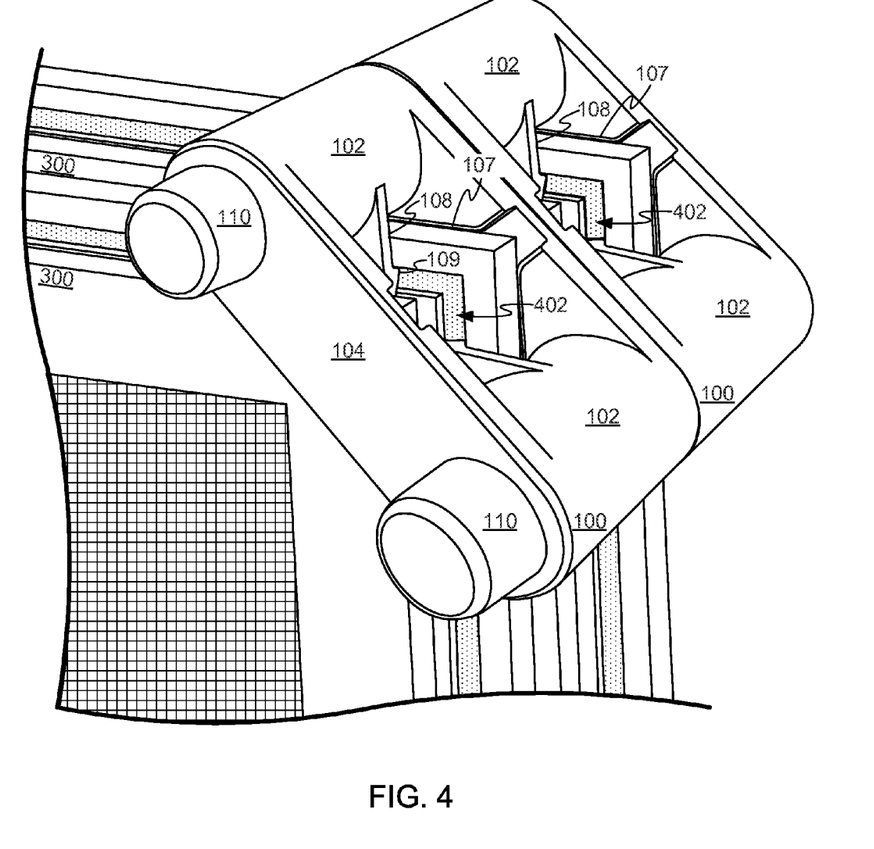
FIG. 4 shows two corner protectors in a stacked up configuration and engaged with interior channels defined by multiple photovoltaic modules.

FIG. 4 shows two corner protectors 100 stacked together and engaged with interior channels 402 defined by photovoltaic modules 300. While only one corner of photovoltaic module 300 is shown, it should be appreciated that corner protectors 100 interact with photovoltaic module 300 regardless of which corner that corner protectors 100 are attached to. As the corner of each of photovoltaic modules 300 is inserted into corner protector 100, attachment features 108 deflect and then snap into position within interior channels 402, leaving engagement feature 109 engaged with a lip defining interior channel 402. The attachment feature 108 engaged with the upper portion of channel 402 prevents corner protectors from inadvertently sliding up and the attachment feature 108 engaged with the lateral portion of channel 402 prevents corner protectors 100 from sliding horizontally away from photovoltaic module 300. In this way, corner protectors 100 can stay firmly attached to photovoltaic modules 300.

FIG. 4 also shows how alignment walls 107 interact with the corners of photovoltaic module 300 to assist in alignment and even contact between corner protector 100 and photovoltaic module 300. Once corner protector 100 is fully installed the peripheral edge of photovoltaic module 300 is trapped between the protruding end of attachment feature 108 and alignment wall 107. FIG. 4 also shows how the tip of the corner of photovoltaic modules 300 protrudes past alignment walls 107. This channel that divides alignment walls 107 allows for irregularities in the tip of the corner of photovoltaic modules 300. This open channel also prevents any pressure from being exerted at the tip of the corner by protector 100, thereby protecting the tip of the corner from being damaged or chipped in any way.

Figure 5:
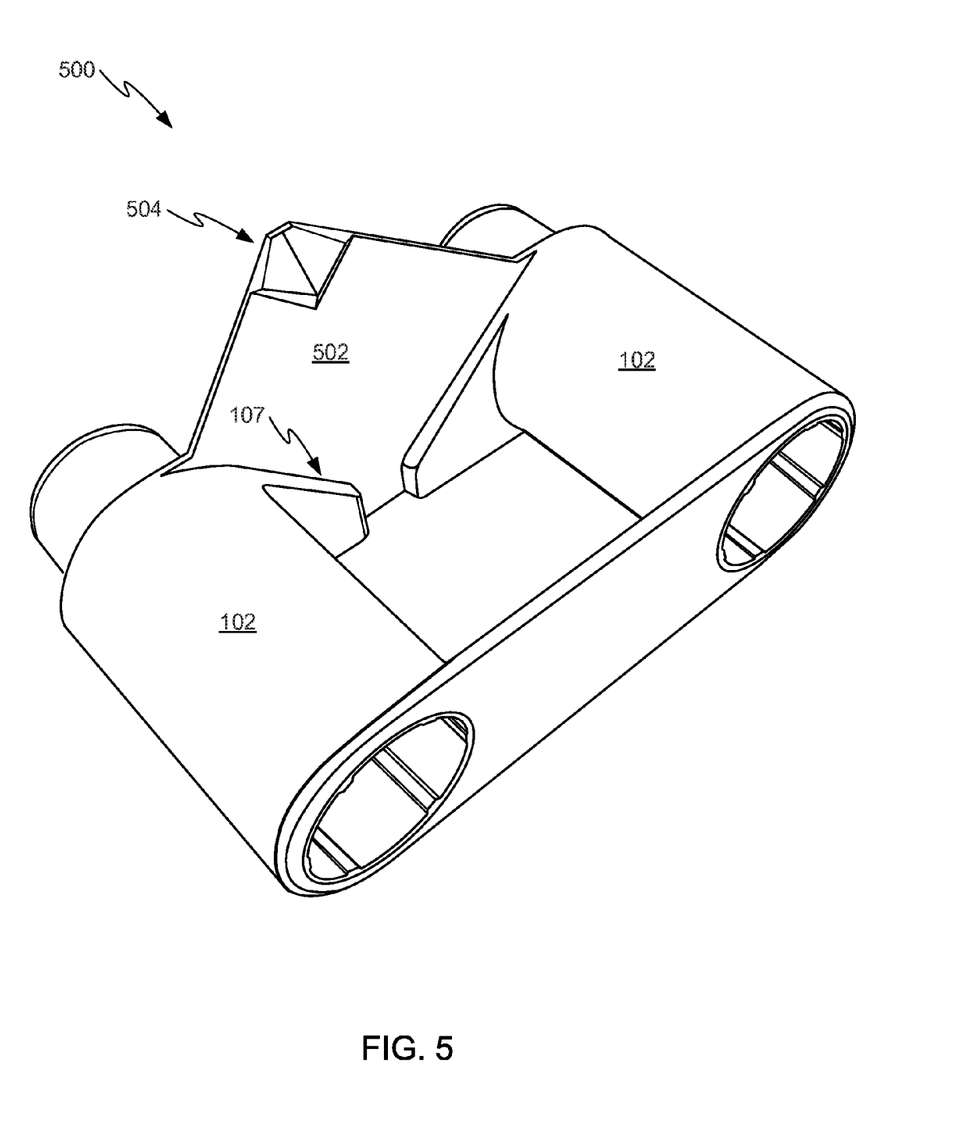
FIG. 5 shows another exemplary embodiment in which a corner protector includes an alternative attachment feature.

FIG. 5 shows an alternative embodiment taking the form of corner protector 500, which includes attachment feature 502 in lieu of attachment features 108. Attachment feature 502 includes engagement feature 504. Engagement feature 504 is configured to engage the interior frame geometry of a corner of a photovoltaic module 300. Engagement feature 504 can have various geometries configured to keep corner protector 500 from rotating out of position with respect to an internal corner of a photovoltaic module. For example, a slope of a forward facing portion of engagement feature 504 is substantially more gradual than a slope of a rear-facing portion of engagement feature 504. This disparity in slopes makes engagement feature 504 substantially easier to engage than to disengage. This can be desirable to reduce a likelihood of corner protector 500 becoming inadvertently disengaged. When corner protector 500 is installed on a corner of a solar panel a portion of the frame of the solar panel is secured between engagement feature 504 and alignment walls 107.

Figure 6:
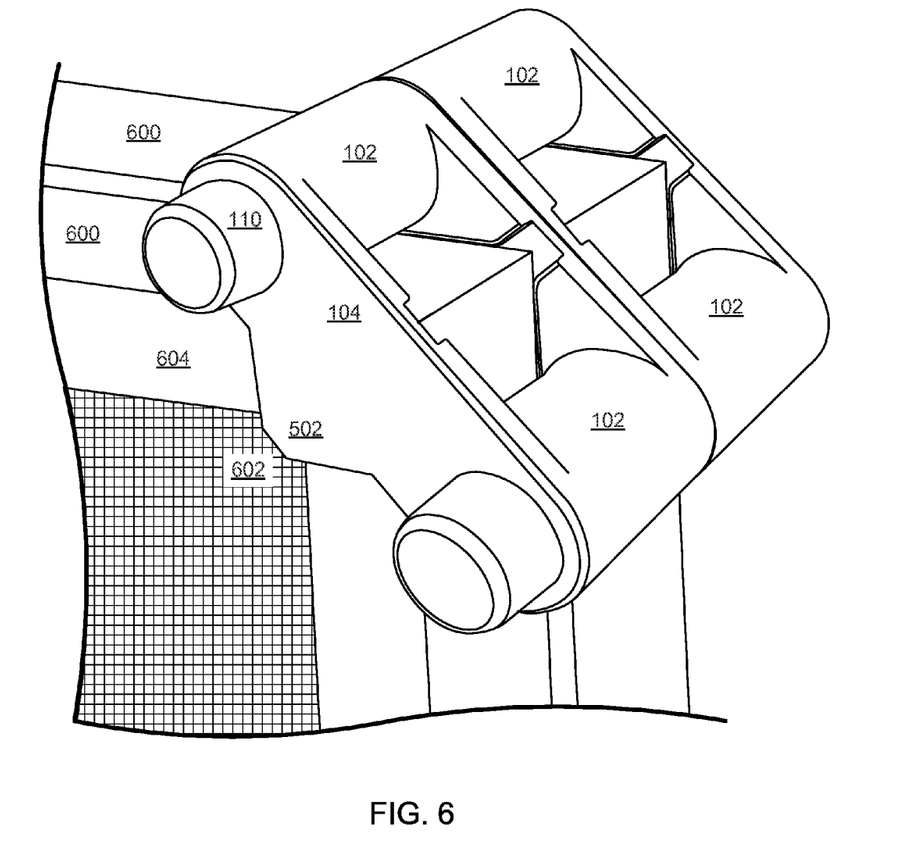
FIG. 6 shows a perspective view of multiple corner protectors along the lines of the corner protector depicted in FIG. 5, stacked together and installed on two adjacent photovoltaic modules.

FIG. 6 shows a perspective view of multiple corner protectors 500 stacked together and installed on two adjacent photovoltaic modules 600. As depicted, photovoltaic modules 600 need not include channels for accommodating attachment features 108. In other words modules 600 may have standard module frames (i.e. non-grooved). Instead of engaging the lip of a groove, in this embodiment engagement feature 504 (not depicted) of attachment feature 502 engages an interior corner of photovoltaic module 600. The interior corner is defined by light gathering region 602 being recessed below front surface 604 of photovoltaic module 600. Consequently, attachment feature 502 can take the form of any securing feature protruding from corner protector 100 that helps to keep corner protectors 500 securely positioned along a corner of photovoltaic modules 600. It should be noted that it is contemplated that in some embodiments, an attachment feature 502 may not be necessary or feasible. For example, photovoltaic modules with flush surfaces on the front and back would be unlikely to work well with the disclosed attachment features. In such a case, an interference fit between the recessed regions 106 and alignment walls 107 of support members 104 could suffice to keep corner protectors 500 in position. As will be discussed below, additional securing features could be employed to keep corner protectors 500 in position during transit (e.g. see FIG. 7C).

Figure 7A:
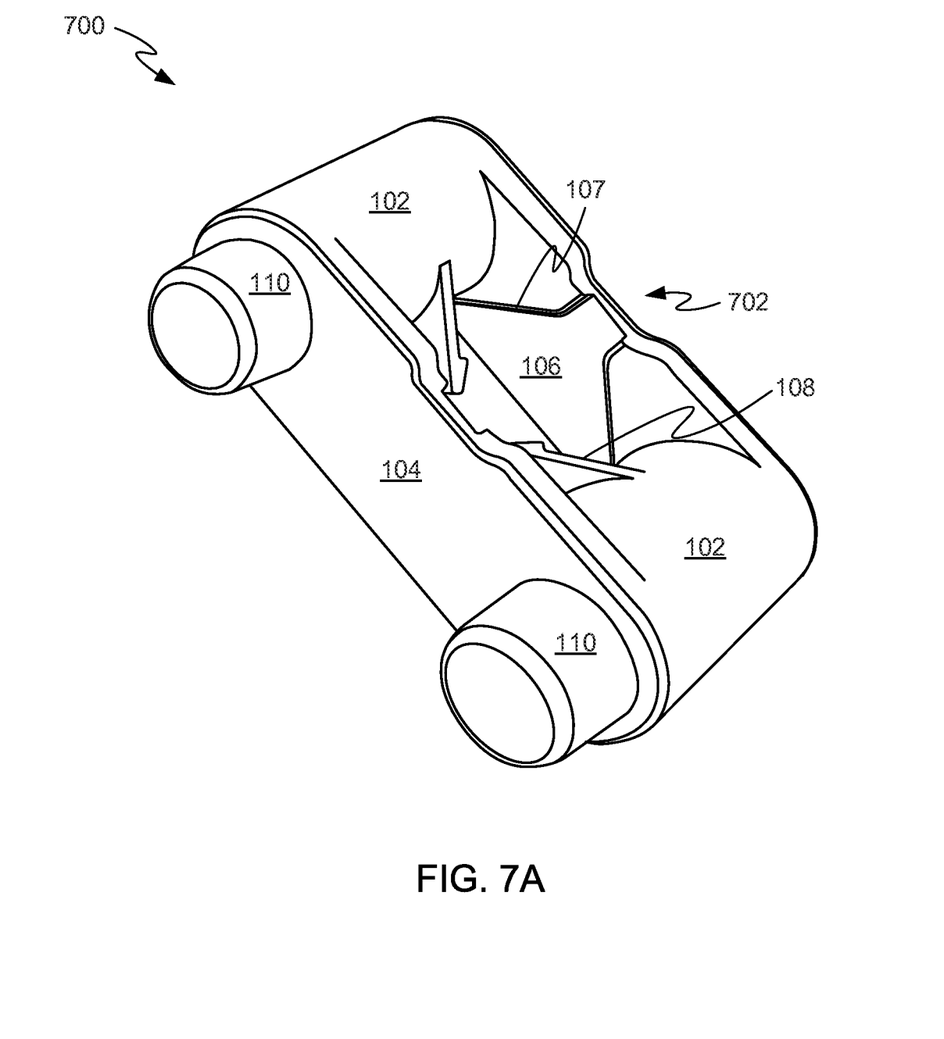
FIG. 7A shows an alternative embodiment of corner protector that defines a channel for keeping a strap in place.

FIG. 7A shows corner protector 700, which is yet an alternative version of corner protector 100. Corner protector 700 is similar to corner protector 100 but includes channel 702 sized to receive a packing strap, which could take the form of a length of webbing for further securing corner protectors 700 to a number of photovoltaic modules. The webbing can be routed along channels 702 of corner protector 700 and then routed along channels 702 of another corner protector 700 positioned on an opposite corner of photovoltaic modules 704. In this way, channels 702 can be arranged to prevent sliding of the webbing along an otherwise flat exterior surface of corner protector 700. It should be noted that channels 702 could also be added to the embodiment of corner protector 500 or to an embodiment that includes no attachment features at all. Corner protectors without attachment features would rely on interaction between alignment walls 107 and corners of a photovoltaic module along with an amount of force exerted on a central portion of the corner protector by the packing strap/webbing to keep the corner protector firmly in position during transit.

Figure 7B:
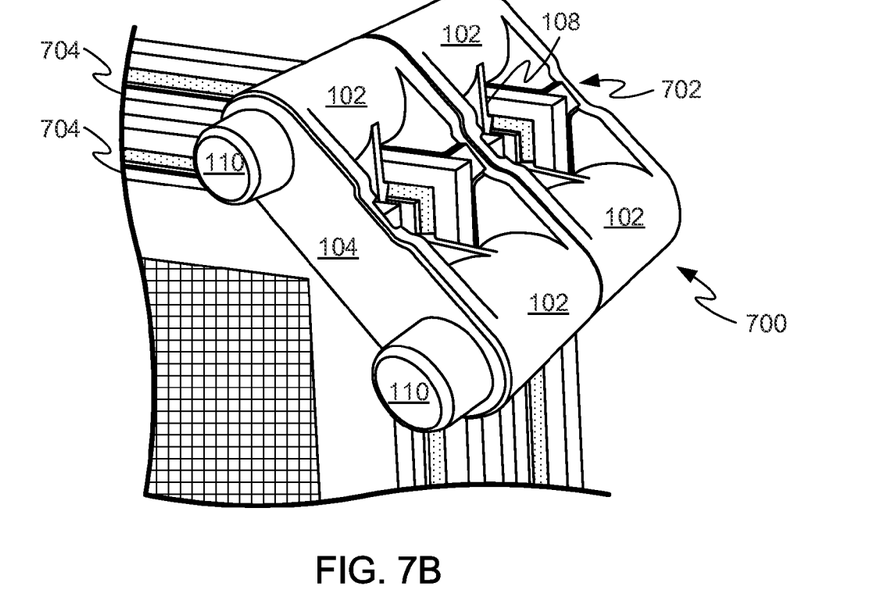
FIG. 7B shows corner protectors in a stacked configuration and installed along corners of multiple adjacent photovoltaic modules.
Figure 7C:
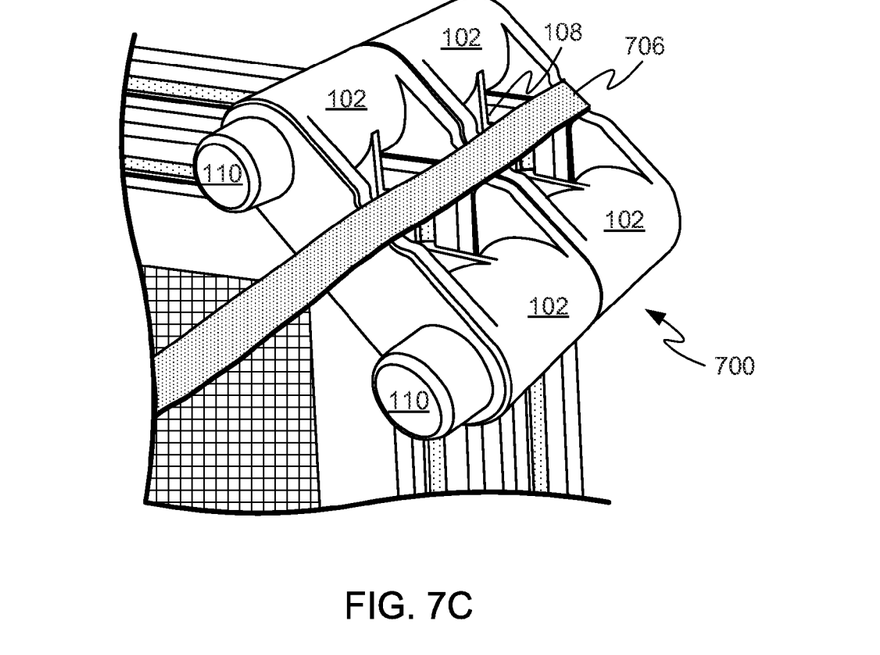
FIG. 7C shows the stacked corner protectors depicted in FIG. 7B with a strap routed through a channel defined by the stacked corner protectors.

FIGS. 7B-7C show corner protectors 700 in a stacked configuration and installed along corners of multiple photovoltaic modules 704. FIG. 7B shows how the depression made by webbing channels 702 are shallow enough so that the corners of photovoltaic modules 704 do not extend into webbing channels 702. It should also be noted that while attachment features 108 are depicted that in some embodiments, the packing strap can obviate the need for attachment features 108.

FIG. 7C shows a length of webbing 706 arranged along webbing channels 702. Webbing 706 can extend across a diagonal of photovoltaic modules 704 to wrap around corner protectors 700 arranged on the opposite corner. In this way, webbing 706 wraps entirely around a stack of photovoltaic modules and release of webbing 706 can be accomplished in a single operation, by for example, releasing a clamp that maintains tension in webbing 706. In some embodiments, webbing 706 can have a width of between 0.5 inches and 1 inch. In one particular embodiment a width of webbing 706 can be about ⅝ of an inch. While the term webbing is used in this particular instance webbing 706 can represent any type of packing strap capable of fitting within channels 702. For example, the packing strap could be formed from steel banding, polypropylene, polyester, nylon or some other filament composite. In some embodiments, the packing strap could be corded and/or woven.

Figure 8A:
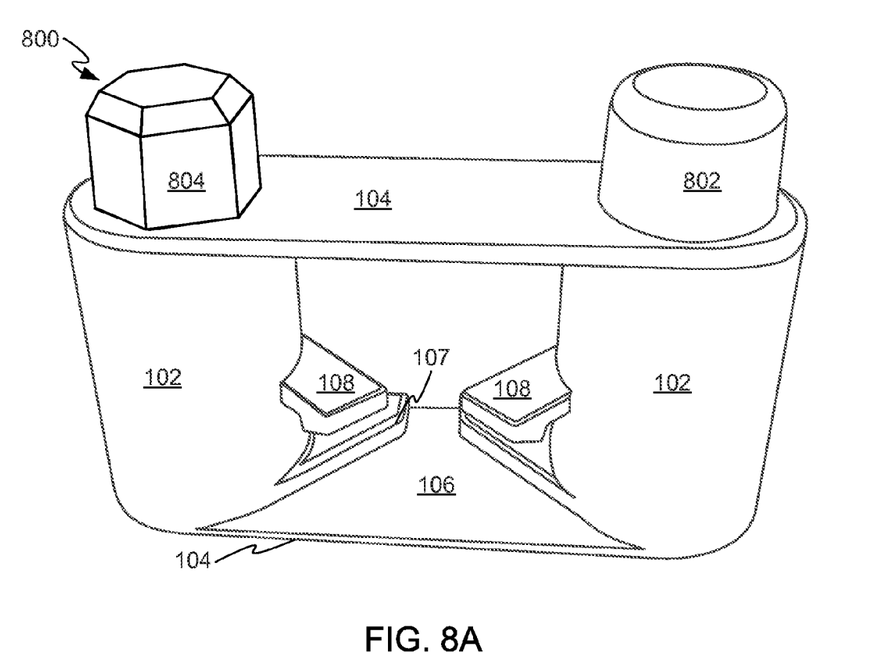
FIGS. 8A-8B show yet another alternative embodiment in which a corner protector includes protrusions having different shapes.
Figure 8B:
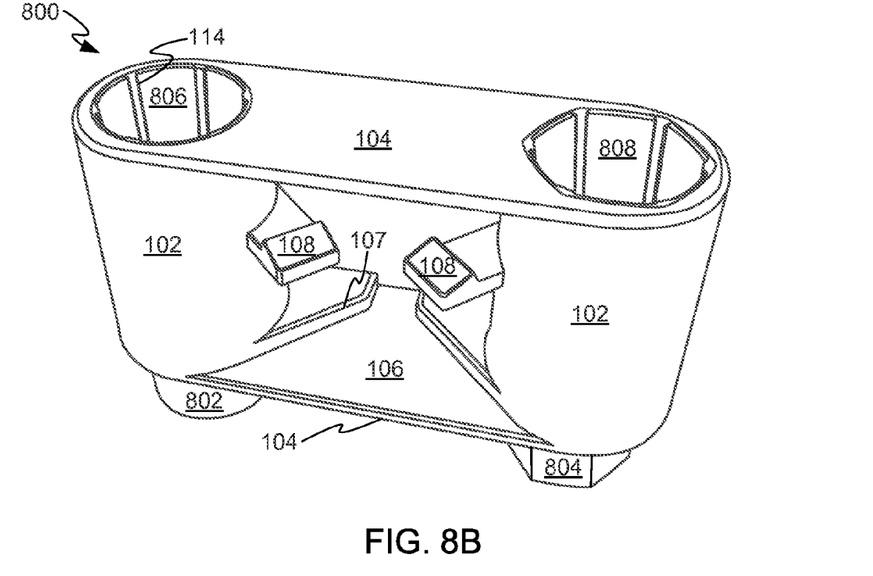

FIGS. 8A-8B show another alternative configuration depicted as corner protector 800. FIG. 8A shows how corner protector 800 includes protrusions 802 and 804, which have different geometries. Protrusion 802 has a substantially cylindrical geometry and protrusion 804 has a substantially hexagonal geometry. By designing the protrusions with different geometries improper stack up of corner protectors 800 can be avoided. FIG. 8B shows how opening 806 is designed to accommodate circular protrusion 802 and opening 808 is designed to accommodate hexagonal protrusion 804. For example, stacking corner protector 800 in the wrong orientation would be prevented by an internal geometry of an opening defined by corner protector 800 not accommodating the geometry of the wrong protrusion. It should also be noted that any variation of a protrusion and its corresponding opening could have the same result. For example, in some embodiments, one of the protrusions and its corresponding opening can be slightly larger than the other, thereby preventing insertion of the larger protrusion into a correspondingly smaller opening.

Figure 9:
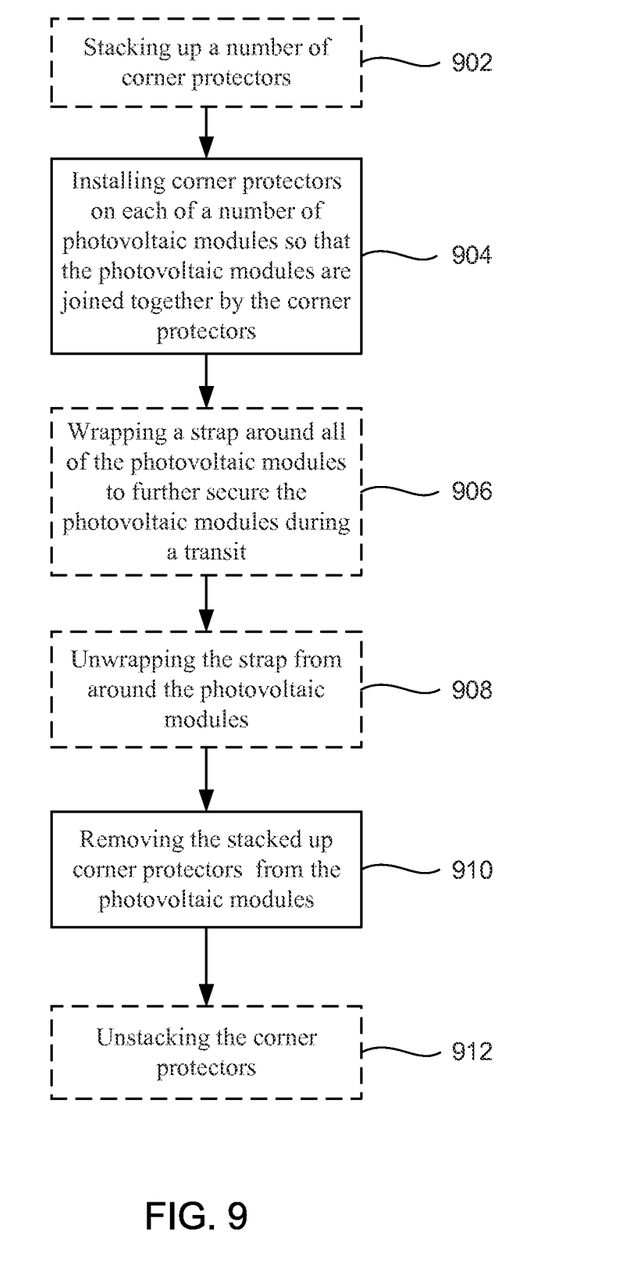
FIG. 9 shows a flow chart illustrating a method for installing and removing multiple corner protectors from multiple photovoltaic modules.

FIG. 9 shows a flow chart illustrating a method for concurrently installing and removing multiple corner protectors from multiple photovoltaic modules. At optional block 902, a number of corner protectors are assembled into multiple stacks, one stack for each corner of the photovoltaic modules. For rectangular photovoltaic modules this would include four stacks of corner protectors. At block 904, when the corner protectors are already stacked up, personnel installing the corner protectors only need to perform one attachment operation for each corner of the stack of photovoltaic modules. In embodiments that do not involve stacking the corner protectors up before installing them on the photovoltaic modules, the packing operation can involve placing four corner protectors on each photovoltaic module and then protrusions associated with corner protectors of one photovoltaic module engage openings defined by corner protectors installed on another photovoltaic module to couple the photovoltaic modules together. At optional block 906, once all the photovoltaic modules have been coupled together a webbed strap can be applied that extends entirely around the stack of photovoltaic modules to further secure the photovoltaic modules together. In some embodiments, the corner protectors can define webbing channels that provide a track along which the webbed strap can be routed. The webbing channels help to prevent the webbed strap from sliding out of position while transporting the photovoltaic modules.

When the photovoltaic modules are ready for unpacking, at block 908, the webbed strap can be removed from the photovoltaic modules by either (1) loosening a buckle and sliding the strap out from around the photovoltaic modules, or (2) simply cutting the strap away and removing it. After removal of the strap is accomplished, at block 910, the corner protectors can be removed from each corner of the stack of photovoltaic modules. One way to remove the corner protectors is to lift one lateral side of the stacked up corner protectors away from the photovoltaic modules. Once rotated by about 30 degrees the stack of corner protectors can be lifted away from the photovoltaic modules in any of a number of directions. The removed corner protectors can then be conveniently stowed in a container for later use. In some embodiments, a container can be designed to accommodate the corner protectors without disassembly of the corner protectors. At optional block 912, the stacked corner protectors can be separated from one another for storage.

The various aspects, embodiments, implementations or features of the described embodiments can be used separately or in any combination.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A modular corner protector suitable for protecting a module, the modular corner protector comprising:
a plurality of hollow cylindrical support structures;
a first support member coupled with both a first end of a first one of the hollow cylindrical support structures and a first end of a second one of the hollow cylindrical support structures, an interior-facing portion of the first support member disposed between the first and second cylindrical support structures and including walls that define a recessed region having a size and shape in accordance with a portion of a corner of the module;
a second support member coupled with both a second end of the first cylindrical support structure and a second end of the second cylindrical support structure;
wherein the support members and the cylindrical support structures cooperate to define an opening configured to receive a corner of the module and wherein each of the hollow cylindrical support structures comprises a protrusion extending from the first end and an opening defined by the second end, the openings having a size and shape suitable for receiving protrusions of another modular corner protector.

2. The modular corner protector as recited in claim 1, wherein engagement of protrusions of one corner protector into openings of another protector allows stacking of multiple modular corner protectors together.

3. The modular corner protector as recited in claim 1, wherein a longitudinal axis of each protrusion is substantially parallel to a longitudinal axis of a corresponding hollow cylindrical support structure.

4. The modular corner protector as recited in claim 1, wherein the openings of the hollow cylindrical support structures extend through the second support member.

5. The modular corner protector as recited in claim 1, further comprising:
a first attachment feature extending laterally from a central portion of the first hollow cylindrical support structure; and
a second attachment feature extending laterally from a central portion of the second hollow cylindrical support structure in a direction substantially orthogonal to a direction in which the first attachment feature extends.

6. The modular corner protector as recited in claim 1, wherein a distance between the first and second support members is about the same as a thickness of the module.

7. The modular corner protector as recited in claim 1, wherein the first support member is substantially parallel to the second support member.

8. A corner protector suitable for protecting a corner of a photovoltaic module, the corner protector comprising:
a first protrusion (110) and a second protrusion extending from a first end of the corner protector;
a second end of the corner protector opposite the first end of the corner protector, the second end defining a first cavity and a second cavity, the first and second cavities spaced apart by the same distance as the first and second protrusions;
curved lateral surfaces configured to facilitate rotation of the corner protector off of the corner of the photovoltaic module; and
an arm protruding laterally from the corner protector, the arm comprising an engagement feature configured to secure the corner protector to the photovoltaic module by engaging a lip of the photovoltaic module when the corner protector is installed on the photovoltaic module.

9. The corner protector as recited in claim 8, wherein the curved lateral surfaces have a semi-circular geometry.

10. The corner protector as recited in claim 8, further comprising:
two cylindrical support structures that include the curved lateral surfaces; and
two support members coupled to opposing ends of the cylindrical support structures.

11. The corner protector as recited in claim 10, wherein the arm is a first arm and the corner protector further comprises a second arm, the first and second arms extending from a first one of the cylindrical support structures and a second one of the cylindrical support structures respectively.

12. The corner protector as recited in claim 10, wherein a longitudinal axis of the first and second protrusions are substantially parallel to a longitudinal axis of the first and second cylindrical support structures.

13. The corner protector as recited in claim 8, wherein the first and second protrusions have different shapes.

14. The corner protector as recited in claim 8, wherein the engagement feature comprises a forward portion having a first slope and a rear portion having a second slope substantially greater than the first slope.

15. A packaging device suitable for protecting a photovoltaic module, the packaging device comprising:
a first support structure and a second support structure, each of the support structures having an exterior-facing surface with a semi-circular geometry;
a first support member coupled with both a first end of the first support structure and a first end of the second support structure, an interior-facing portion of the first support member disposed between the first and second support structures and including walls that define a recessed region having a size and shape in accordance with a portion of a corner of the photovoltaic module; and
a second support member coupled with both a second end of the first support structure and a second end of the second support structure;
a plurality of protrusions extending from an exterior facing surface of the first support member; and
a plurality of recesses defined by an exterior facing surface of the second support member.

16. The packaging device as recited in claim 15, wherein the first support member is substantially parallel to the second support member.

17. The packaging device as recited in claim 16, wherein the first support structure is substantially parallel to the second support structure.

18. The packaging device as recited in claim 17, further comprising an attachment feature extending laterally from the first support structure and at least partially towards the second support structure.

19. The packaging device as recited in claim 18, wherein a central portion of both the first and second support structures defines recesses configured to align a packing strap with the packaging device.

20. The packaging device as recited in claim 15, wherein a longitudinal axis of each of the plurality of protrusions is aligned with a longitudinal axis of each of the plurality of recesses.

* * * * *